US006574105B2

(12) United States Patent
Nakano et al.

(10) Patent No.: US 6,574,105 B2
(45) Date of Patent: Jun. 3, 2003

(54) HOUSING FOR ENCLOSING MEASURING APPARATUS FOR RECORDING APPARATUS, PROVIDED WITH AIR BLOWING MEANS INCLUDING HIGH EFFICIENCY PARTICULATE AIR FILTER

(75) Inventors: Norio Nakano, Hyogo (JP); Eiji Ishimoto, Hyogo (JP); Hiroshi Kaminaga, Hyogo-ken (JP)

(73) Assignee: Agilent Technologies, Inc., Palo Alto, CA (US)

(*) Notice: Subject to any disclaimer, the term of this patent is extended or adjusted under 35 U.S.C. 154(b) by 0 days.

(21) Appl. No.: 10/004,329

(22) Filed: Nov. 2, 2001

(65) Prior Publication Data

US 2002/0089824 A1 Jul. 11, 2002

(30) Foreign Application Priority Data

Jan. 10, 2001 (JP) ....................................... 2001-002491

(51) Int. Cl.[7] .................................................. H05K 7/20

(52) U.S. Cl. .................. 361/695; 62/259.2; 360/97.03; 324/212; 361/679

(58) Field of Search ...................... 62/259.2; 360/97.02, 360/97.03, 97.04, 98.07, 99.12; 361/694–695, 679, 600; 369/77.1, 77.2, 222; 324/212, 262, 272, 273; 454/184

(56) References Cited

U.S. PATENT DOCUMENTS

| | | | | |
|---|---|---|---|---|
| 3,846,835 A | * | 11/1974 | Howovitz et al. | 360/970.03 |
| 4,317,146 A | * | 2/1982 | Gervais | 360/97.03 |
| 5,031,059 A | * | 7/1991 | Yamaguchi et al. | 361/97.03 |
| 6,229,304 B1 | * | 5/2001 | Guzik | 360/97.03 |

FOREIGN PATENT DOCUMENTS

| | | |
|---|---|---|
| JP | 2-4145 | 6/1988 |

* cited by examiner

*Primary Examiner*—Gregory Thompson

(57) ABSTRACT

A housing for enclosing a measuring apparatus for a hard disk recording medium and a recording apparatus for recording a signal on the hard disk recording medium is provided with a fan including a high efficiency particulate air filter. The fan blows air onto the hard disk recording medium and the recording apparatus under measurement through the high efficiency particulate air filter at a substantially constant air temperature and at a substantially constant air flow rate. An automatic door is located at a position other than an air protection area which includes positions of the hard disk recording medium under measurement by the recording apparatus and the recording apparatus, and includes a predetermined surrounding area. The automatic door shields the other area from the air protection area in the housing for enclosing the measuring apparatus under no measurement.

8 Claims, 8 Drawing Sheets

FIRST PREFERRED EMBODIMENT

FIRST PREFERRED EMBODIMENT

SECOND PREFERRED EMBODIMENT

THIRD PREFERRED EMBODIMENT

HOUSING FOR ENCLOSING MEASURING APPARATUS FOR RECORDING APPARATUS, PROVIDED WITH AIR BLOWING MEANS INCLUDING HIGH EFFICIENCY PARTICULATE AIR FILTER

BACKGROUND OF THE INVENTION

1. Field of the Invention

The present invention relates to a housing for enclosing a measuring apparatus for a recording apparatus such as a magnetic head, a recording medium of a hard disk drive unit, or the like, and in particular, to a housing for enclosing a measuring apparatus, provided with air blowing means including a high efficiency particulate air filter.

2. Description of the Related Art

In a conventional measuring apparatus for use in a recording apparatus such as a hard disk drive unit, a recording medium such as a hard disk or the like is covered with a cover, and the cover is opened in only a small area for a measuring part or the whole apparatus is covered with a cover, in order to reduce the influence of variation in ambient temperature and winds.

When the recording medium is covered with the cover which is opened in only the small area for the measuring part, the cover located around the recording medium imposes limits the measuring range of the recording medium. Moreover, the cover cannot completely keep out of external temperatures and winds having unstable directions, and this leads to variation in results of measurement.

Further, in the case where the whole apparatus is covered with the cover, there is the following problem. The heat generated by a spindle, a motor or the like causes a difference in temperature between an internal area within the cover of the measuring apparatus, and an outer area thereof, and thus, the temperature in the internal area within the cover thereof changes due to opening and closing of a door upon replacement of magnetic heads, then wind is generated, this leads to variation in the results of the measurement.

Recently, hard disk manufacturers have increased a recording density of the recording medium accompanying with increase in a recording capacity of the hard disk drive unit. Accompanying with this, it has been necessary to provide a glass-recording medium having a high surface precision in order to keep a flying height of a magnetic head stable. It is a known fact that the glass-recording medium is easy to break as compared with an aluminum recording medium and that flying broken glass is dangerous. The cover opened in only the small area for the measuring part is not used for the measurement by means of the glass-recording medium in consideration of safety. When the whole apparatus is covered with the cover, the spindle is stopped at the time of the replacement of the magnetic head in order to improve safety. When the spindle is stopped, heat generated by the acceleration of the spindle causes a change in temperature of the recording medium and its surroundings and thus results in a deterioration in the precision.

SUMMARY OF THE INVENTION

It is an essential object of the present invention to provide a housing for enclosing a measuring apparatus for a recording apparatus, which is capable of maintaining the environment of temperature and air flow around a recording medium and a magnetic head which are objects to be measured by the measuring apparatus for the recording apparatus such as a hard disk drive unit, thereby preventing variation in results of measurement.

In order to achieve the aforementioned objective, according to one aspect of the present invention, there is provided a housing for enclosing a measuring apparatus for a recording medium and a recording apparatus for recording a signal on the recording medium, comprising:

air blowing means including a high efficiency particulate air filter, the air blowing means blowing air onto the recording medium and the recording apparatus under measurement, through the high efficiency particulate air filter, at a substantially constant air temperature and at a substantially constant air flow rate.

The above-mentioned housing preferably further comprises an automatic door located at a position other than an air protection area which includes positions of the recording medium under measurement by the recording apparatus and the recording apparatus and includes a predetermined surrounding area, the automatic door shielding the other area from the air protection area in the housing for enclosing measuring apparatus under no measurement.

Further, the above-mentioned housing preferably further comprises an outer door adapted to open and close only when the automatic door shields the other area from the air protection area.

Furthermore, the above-mentioned housing preferably further comprises moving means for moving the recording medium and the recording apparatus to be measured, to the air protection area when the automatic door is open.

Furthermore, in the above-mentioned housing, the recording medium is preferably a hard disk recording medium, and the recording apparatus comprises a magnetic head.

BRIEF DESCRIPTION OF THE DRAWINGS

These and other objects and features of the present invention will become clear from the following description taken in conjunction with the preferred embodiments thereof with reference to the accompanying drawings throughout which like parts are designated by like reference numerals, and in which.

DETAILED DESCRIPTION OF THE PREFERRED EMBODIMENTS

Preferred embodiments of the present invention will be described below with reference to the drawings.

First Preferred Embodiment

Figure 1:
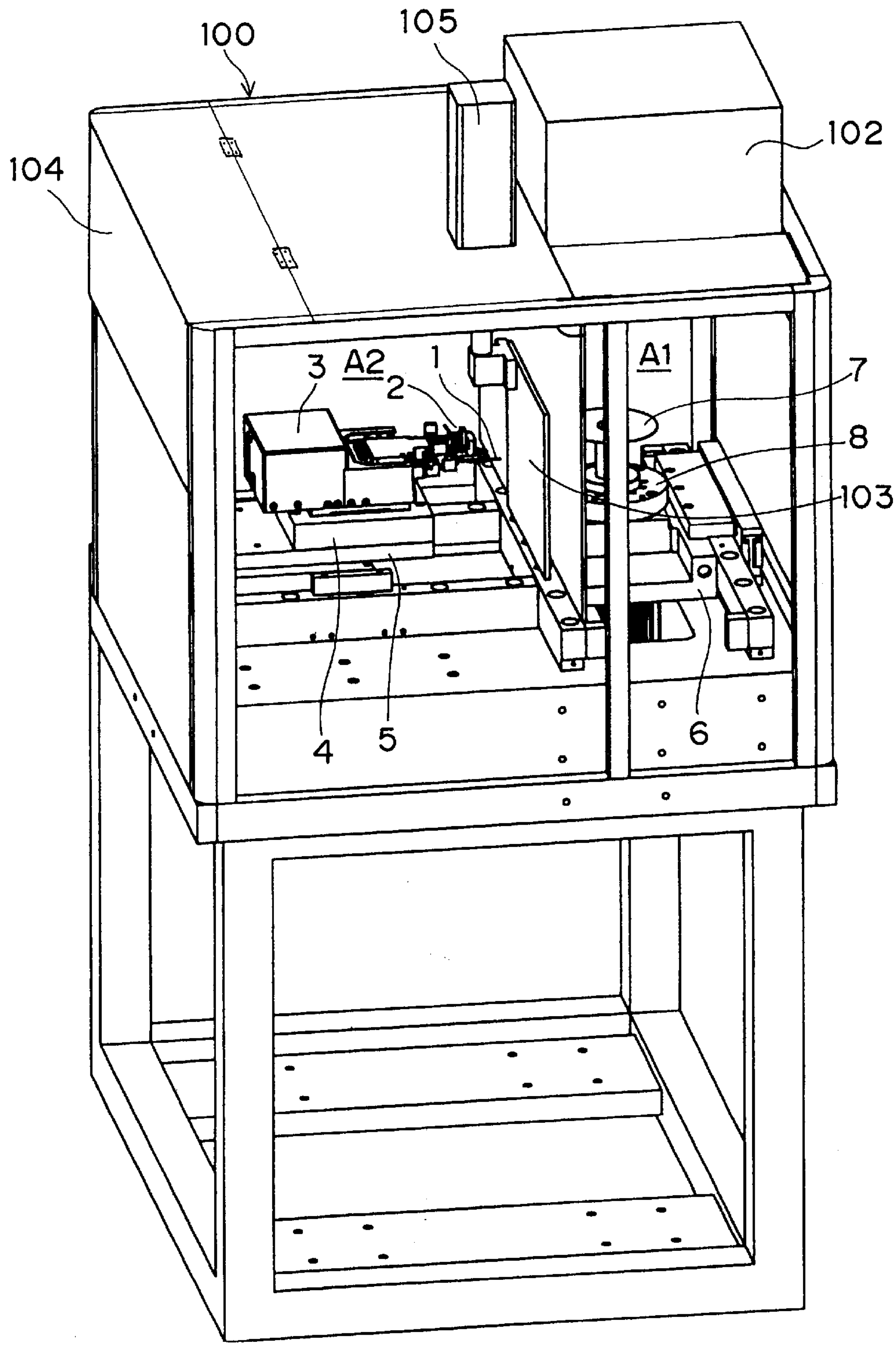
FIG. 1 is a partially cutaway perspective view showing an elevation of a housing 100 for enclosing the measuring apparatus for a recording apparatus according to a first preferred embodiment of the present invention.
Figure 2:
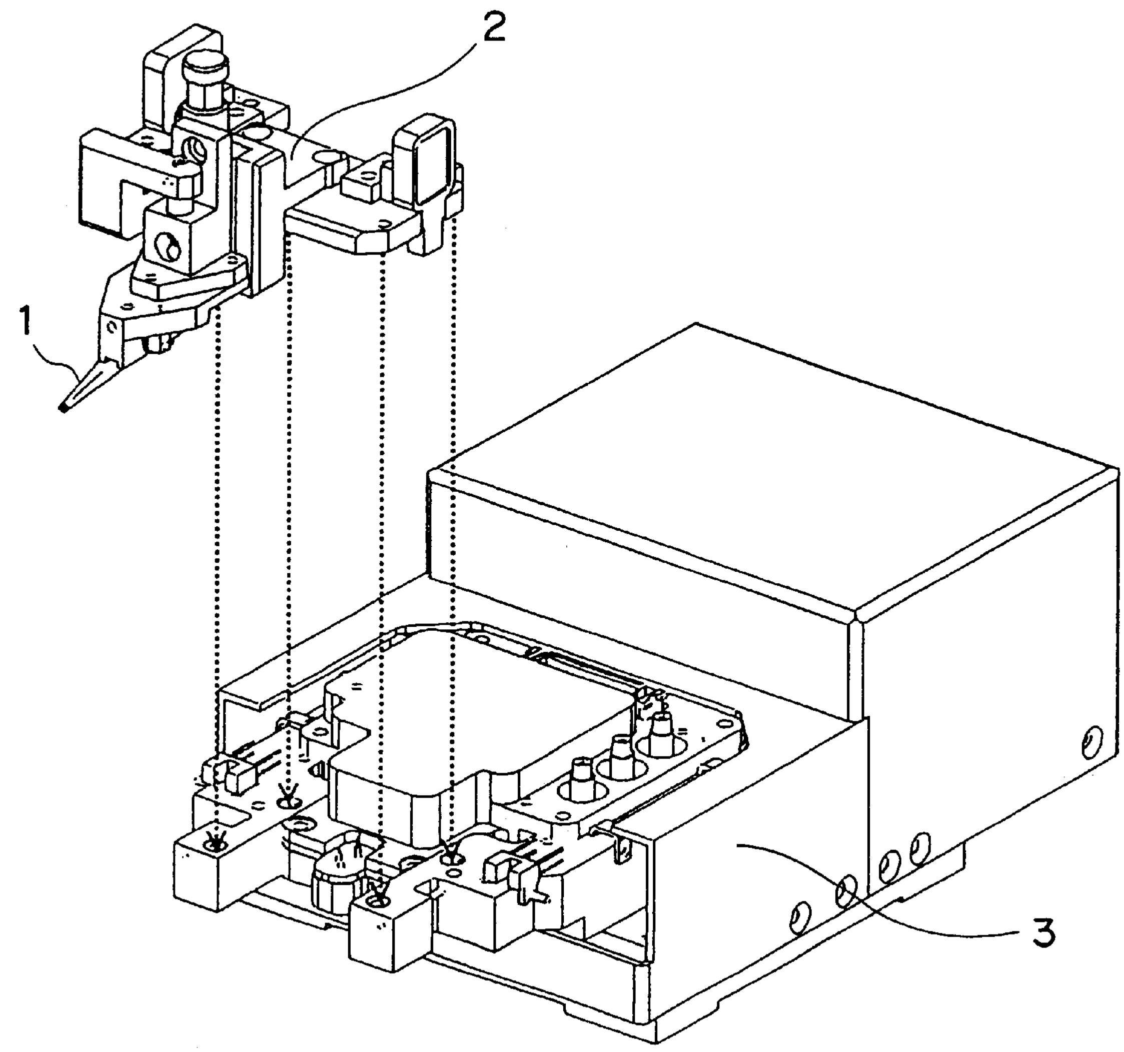
FIG. 2 is a perspective view showing a magnetic head 1, a cassette 2, a head loading mechanism 3 and peripheral units thereof shown in FIG. 1.

FIG. 1 is a partially cutaway perspective view showing an elevation of a housing 100 for enclosing a measuring apparatus for a recording apparatus according to a first preferred embodiment of the present invention. FIG. 2 is a perspective view showing a magnetic head 1, a cassette 2, a head loading mechanism 3 (hereinafter referred to as an HLM) and peripheral units thereof shown in FIG. 1.

Referring to FIG. 1, the housing 100 for enclosing the measuring apparatus according to the first preferred embodiment is provided which reads out a measurement signal written on a hard disk recording medium 7 by the magnetic head 1, and measures the intensity of the measurement signal, a write track width or the like so as to check the performance of the magnetic head. In the housing 100 for enclosing the measuring apparatus, a fan 102 includes a high efficiency particulate air filter. In this case, the high efficiency particulate air filter is typically a generic name for an air filter capable of removing various particles of sub-micron size with efficiency as high as 99.9% or more, and the high efficiency particulate air filters include air filters that are commercially available, such as commonly called a HEPA (High Efficiency Particulate Air) filter as described later, an ULPA (Ultra Low Penetration Air) filter. Hereinafter, the description is given with reference to the HEPA filter because this filter gives a full understanding of the present invention, unless it is otherwise specified.

The fan 102 is characterized in blowing air onto the hard disk recording medium 7 and the recording apparatus under measurement through the HEPA filter preferably at a substantially constant air temperature and at a substantially constant air flow rate. An automatic door 103 is characterized in being located at a position other than an air protection area A3 (See FIG. 4), namely, not projecting into the air protection area A3 including the positions of the hard disk recording medium 7 and the recording apparatus under measurement and its predetermined surrounding area, and the automatic door 103 shields the other area from the air protection area A3 in the housing 100 for enclosing the measuring apparatus when measurement does not take place. In this case, the air protection area A3 is ranged in an area of a projection surface $(a-2\alpha)\times(b-2\alpha)$ from a top surface of a cover 101 to the apparatus body (this projection surface is an area shown by a dotted line in FIG. 4, and a denotes a margin length). Then, there is characterized in being provided the automatic door 103 for shielding an area A1 of the hard disk recording medium 7 from a replacement area A2 of the magnetic head 1 at the position other than the air protection area A3.

As shown in a detail view of FIG. 2, the magnetic head 1 that is an object to be measured is fixed to a jig which is called a cassette 2 (hereinafter referred to as a cassette), by a force applied by an elastic body such as a spring or the like, and the cassette 2 is mounted at a predetermined position on the HLM 3 by an operator. By a Y stage 5 for moving in the Y direction and an X stage 6 for moving in the X direction perpendicular to the Y direction, the cassette 2 is moved to a part of the hard disk recording medium 7 to be measured, and then measurement is started. At that time, the hard disk recording medium 7 is rotated by a spindle 8, and the magnetic head 1 is positioned with very high precision by a piezoelectric stage 4.

Figure 3:
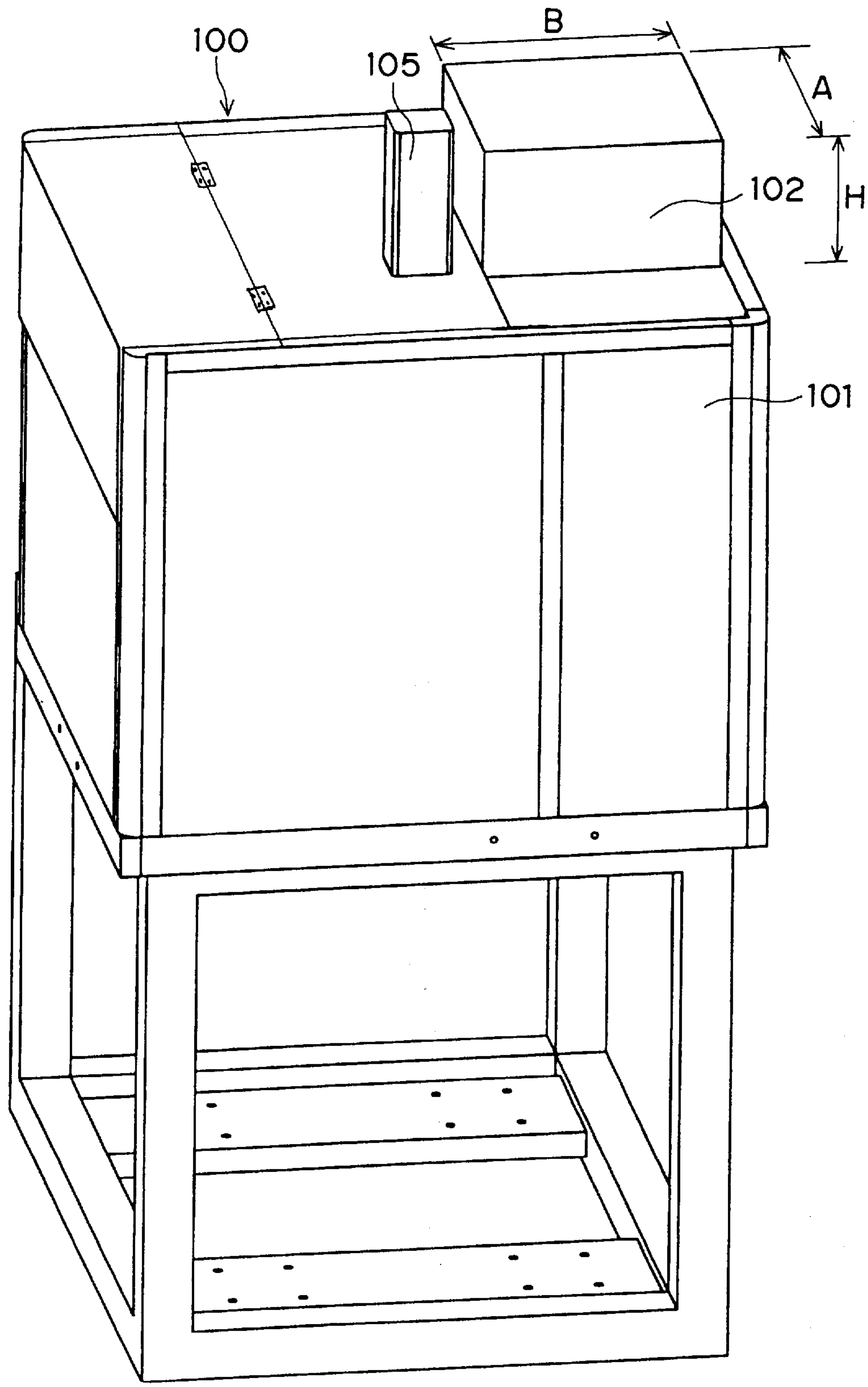
FIG. 3 is a perspective view showing an elevation of the housing 100 for the measuring apparatus shown in FIG. 1, together with covers closed.
Figure 4:
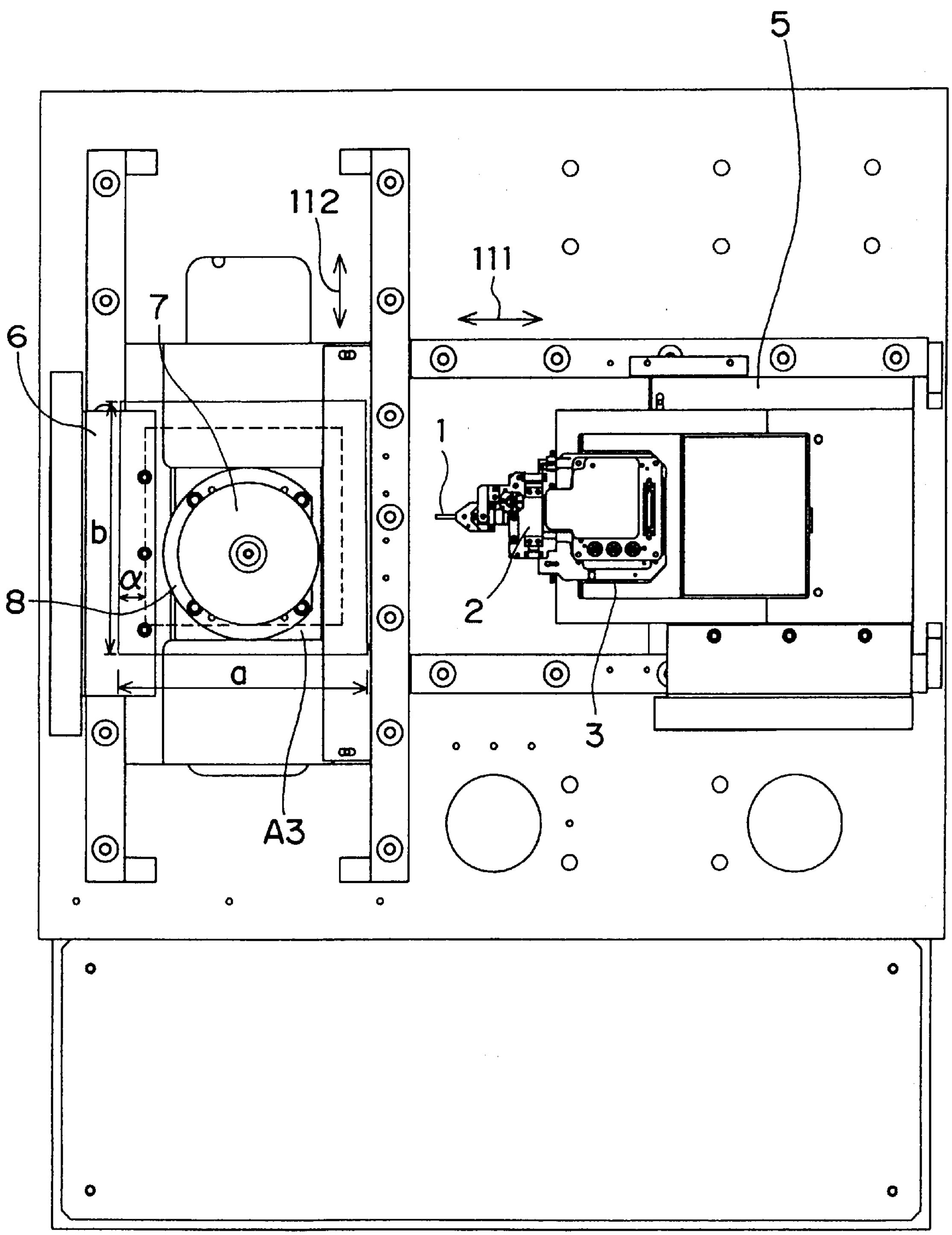
FIG. 4 is a cutaway top view showing the magnetic head 1, the cassette 2, the head loading mechanism 3, a hard disk recording medium 7 and the peripheral units thereof shown in FIG. 1.

FIG. 3 is a perspective view showing an elevation of the housing 100 for enclosing the measuring apparatus shown in FIG. 1, together with the covers closed. FIG. 4 is a cutaway top view showing the magnetic head 1, the cassette 2, the head loading mechanism 3, the hard disk recording medium 7 and the peripheral units thereof shown in FIG. 1.

As shown in FIGS. 1 to 4, the housing 100 for enclosing the measuring apparatus according to the first preferred embodiment is provided for checking the magnetic head 1 for writing a measurement signal on the hard disk recording medium 7 and then reading out the measurement signal, and comprises the cover 101 for covering the measuring apparatus and the fan 102 with the HEPA filter located above the hard disk recording medium 7 and placed on the top surface of the cover 101. In the air protection area A3 that is the projection surface $(a\times2\alpha)\times(b-2\alpha)$ from the top surface of the cover 101 to the apparatus body, when the fan 102 with the HEPA filter has dimensions of a depth A×a width B×a height H as shown in FIG. 3, an air outlet has dimensions of a×b, where a<A and b<B. The margin length a is expressed by the following equation:

$$a=c\times(\text{thickness of the cover } \mathbf{101}) \tag{1}$$

where c denotes a multiplication constant by which the thickness of the cover 101 is multiplied, and the constant c is preferably ranged from 0.2 to 0.5, for example. There is provided the automatic door 103 for shielding the area A1 of the hard disk recording medium 7 from the replacement area A2 of the magnetic head 1 at the position other than the air protection area A3.

Further, the HEPA filter attached to the fan 102 is an abbreviation for a "High Efficiency Particulate Air filter" and has been developed by NASA in the 1950s. The HEPA filter is a filter, which has the performance of removing various types of particles with 99.97% or higher efficiency regardless of whether the particles are dust particles, pollen, bacteria or the like, as long as the particles are each 0.3 micron or more in size. Although the HEPA filter has been made of cellulose asbestos at the early stages of development, the HEPA filter is currently made of glass wool, and it is used in a form made by folding a paper-shaped filtering material of glass wool.

Figure 5:
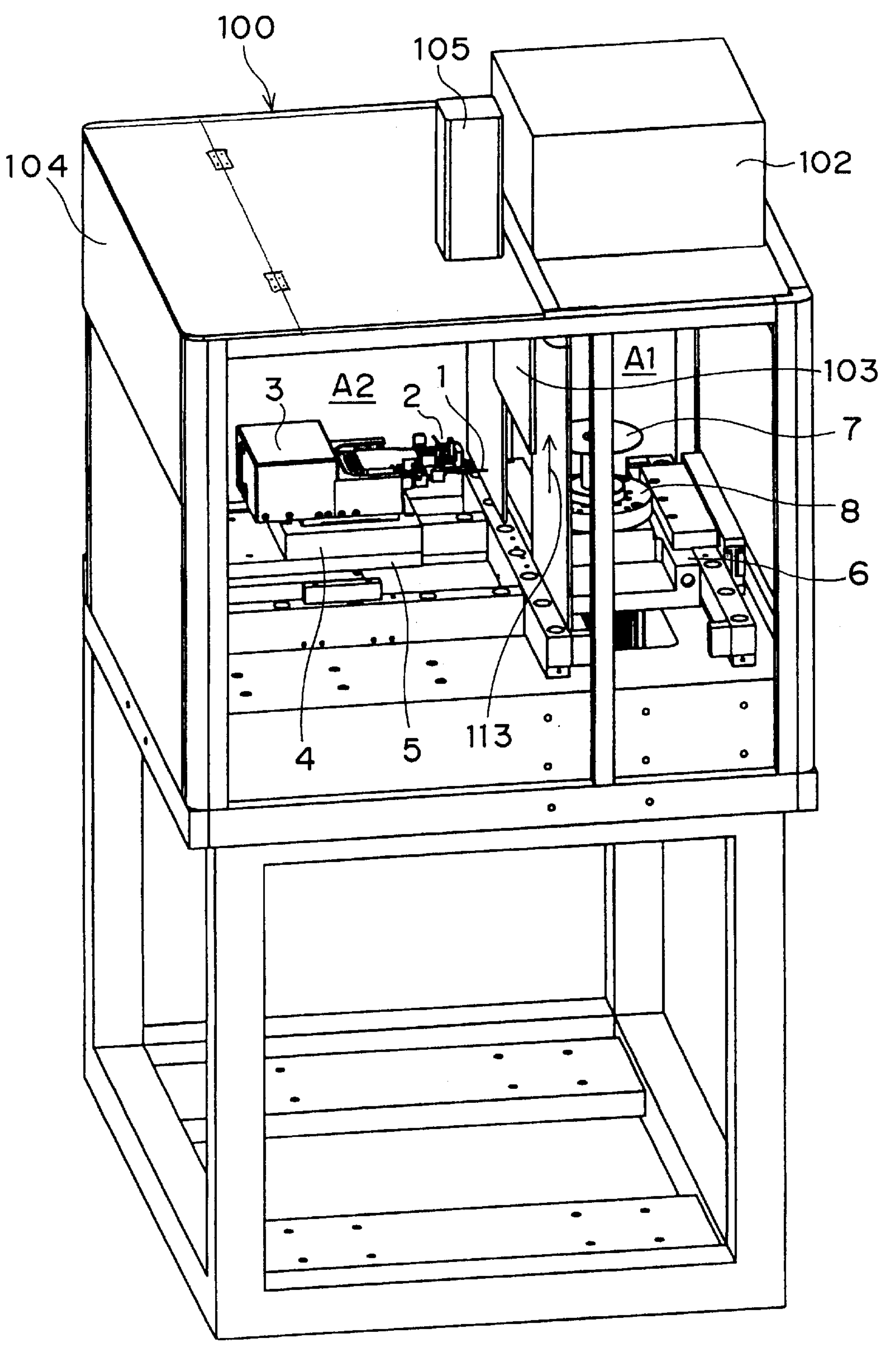
FIG. 5 is a partially cutaway perspective view of the housing 100 for enclosing the measuring apparatus shown in FIG. 1, together with an automatic door 103 opened.

During the measurement by the measuring apparatus configured as described above, the spindle 8 of the measuring apparatus always keeps on revolving. The fan 102 with the HEPA filter revolves at constant rpm, thus blows air downward from an area located above the hard disk recording medium 7 toward the hard disk recording medium 7 through the HEPA filter preferably at a substantially constant air temperature, at a substantially constant air flow rate, and at a high degree of cleanness, and then exhausts the air outward through a lower portion of the housing 100 for enclosing the measuring apparatus (e.g., slits in the lower position of side walls or a gap between a pedestal on which the measuring apparatus is placed and side walls). The air makes the airflow around the hard disk recording medium 7 constant, thereby always keeping the environment around the hard disk recording medium 7 stable. In this state, the Y stage 5 moves in the direction shown by an arrow 111, the X stage 6 moves in the direction shown by an arrow 112, then the automatic door 103, which is located at the position where the hard disk recording medium 7 is shielded from the magnetic head 1, is opened upward in the direction shown by an arrow 113 as shown in FIG. 5, the magnetic head 1 writes a measurement signal onto the hard disk recording medium 7 and then reads out the measurement signal, thereby performing the measurement of the hard disk recording medium 7.

After the measurement, the Y stage 5 moves in the direction shown by the arrow 111, the X stage 6 moves in the direction shown by the arrow 112, and the automatic door 103 moves downward. Thus, at the position other than the air protection area A3 having the projection surface $(a-2\alpha)\times(b-2\alpha)$ shown in FIG. 4, the area A1 of the hard disk recording medium 7 shown on the right side in FIG. 5 is shielded from the replacement area A2 of the magnetic head 1 shown on the left side in FIG. 5 (this area is a space area in which the magnetic head 1 is replaced with another head when the hard disk recording medium 7 is not measured). That is, all the operating area of the automatic door 103 is not included in, namely does not project or intrude into the air protection area A3 having the projection surface $(a-2\alpha)\times(b-2\alpha)$ so as not to interrupt the airflow.

Figure 6:
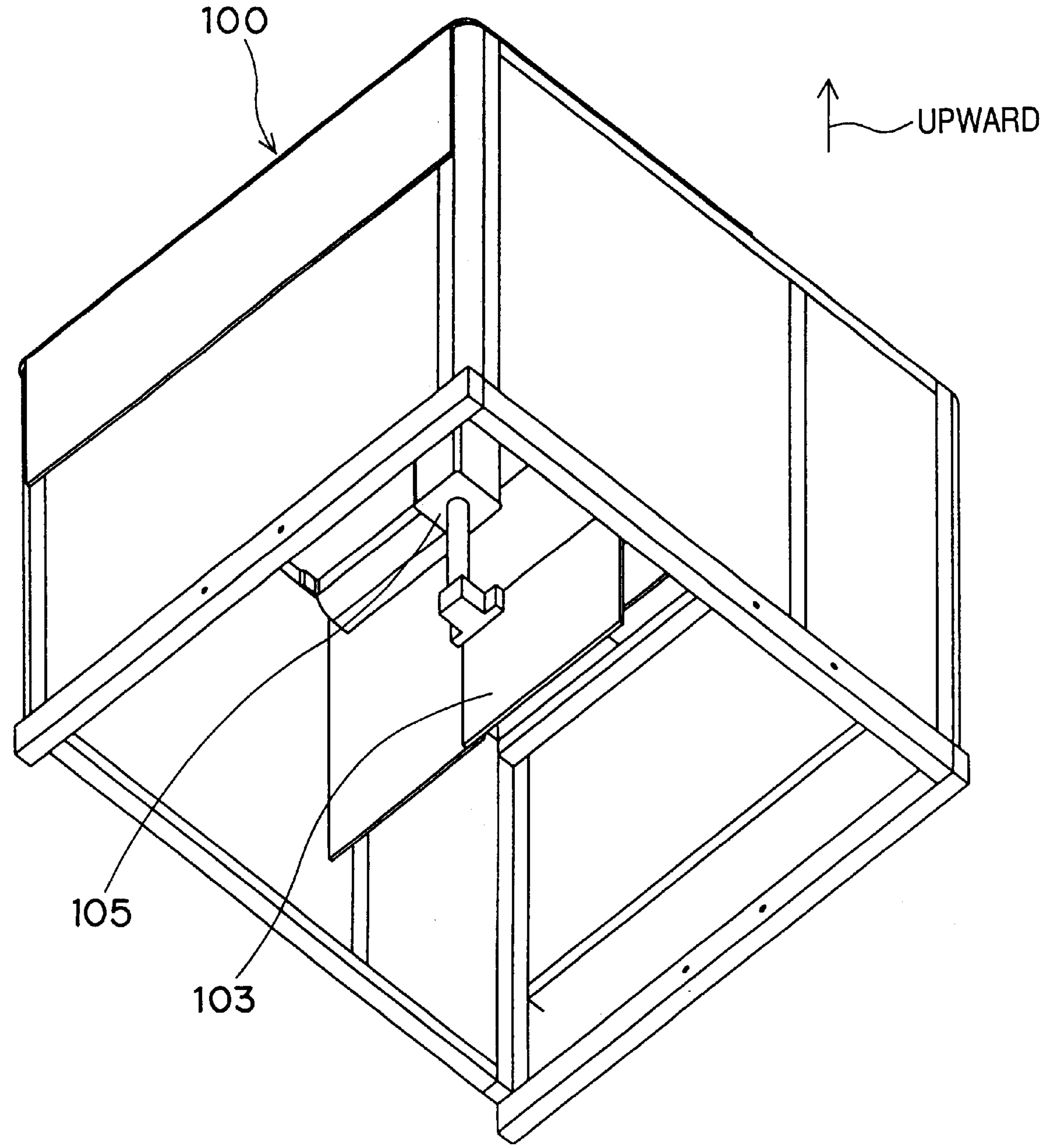
FIG. 6 is a partially cutaway perspective view showing an upper portion of the housing 100 for enclosing the measuring apparatus shown in FIG. 1 when seeing the same from a bottom thereof.

Next, the automatic door 103 shields the head replacement area A2 from the hard disk recording medium area A1, and thereafter the operator opens an outer door 104, replaces the magnetic head 1 with another head, and closes the outer door 104. After that, the automatic door 103 is opened upward in the direction shown by the arrow 113, the Y stage 5 and the X stage 6 move respectively, and the measurement of the hard disk recording medium 7 is started. In this case, as shown in FIG. 6, the automatic door 103 is operated by an air cylinder 105 provided on the top surface of the housing 100 for enclosing the measuring apparatus, and the outer door 104 is manually opened and closed by the operator. Further, the outer door 104 is adapted to open only when the automatic door 103 shields the head replacement area A2 from the hard disk recording medium area A1, and thus the measurement does not start when the outer door 104 is not closed. The fan 102 with the HEPA filter takes in the outside air outside the housing 100 at a substantially constant air flow rate, and blows the air having high cleanness from the outside thereof into the inside thereof, thereby forming a barometric pressure in the housing 100 a little higher than that of the barometric pressure outside the housing 100. Therefore, the outside air entering through the door 104 during the replacement of heads does not reach to location near the hard disk recording medium 7, so that the hard disk recording medium 7 and its surroundings can be kept stable.

The inventors performed 20 measurements of track profile characteristics of the hard disk recording medium 7 when the housing 100 for enclosing the measuring apparatus was attached and was not attached. According to the results of measurement, we confirmed that variation in the track profile characteristics becomes very small when the housing 100 is attached.

The housing 100 for enclosing the measuring apparatus according to the first preferred embodiment configured as described above can obtain the following specific advantageous effects.

(1) Since the fan 102 blows air into the housing 100 for enclosing the measuring apparatus through the HEPA filter, the blown air can prevents heat from being confined within the housing 100 for enclosing the measuring apparatus, and therefore, the measurement can be realized in a more stable environment, so that variation in the results of measurement of the hard disk recording medium 7 can become smaller than the variation in the results of measurement in the prior art. That is, it is possible to keep constant or maintain an environment such as a temperature, a temperature profile and air around the hard disk recording medium 7 and the magnetic head 1 for writing a measurement signal on the recording medium 7 and to thus obtain stable results of measurement.

(2) Since the hard disk recording medium 7 can keep on revolving, it is possible to substantially reduce the influence of expansion and contraction of the hard disk resulting from a change in temperature due to a change in revolution of the spindle.

(3) The longevity of an electric circuitry and the spindle motor 8 for writing and reading a measurement signal on and from the hard disk recording medium 7 can be increased.

(4) Since air is always blown, the spindle motor 8 can always keep on revolving, so that the measurement can be performed without consideration of the start speed of the spindle motor 8.

Second Preferred Embodiment

Figure 7:
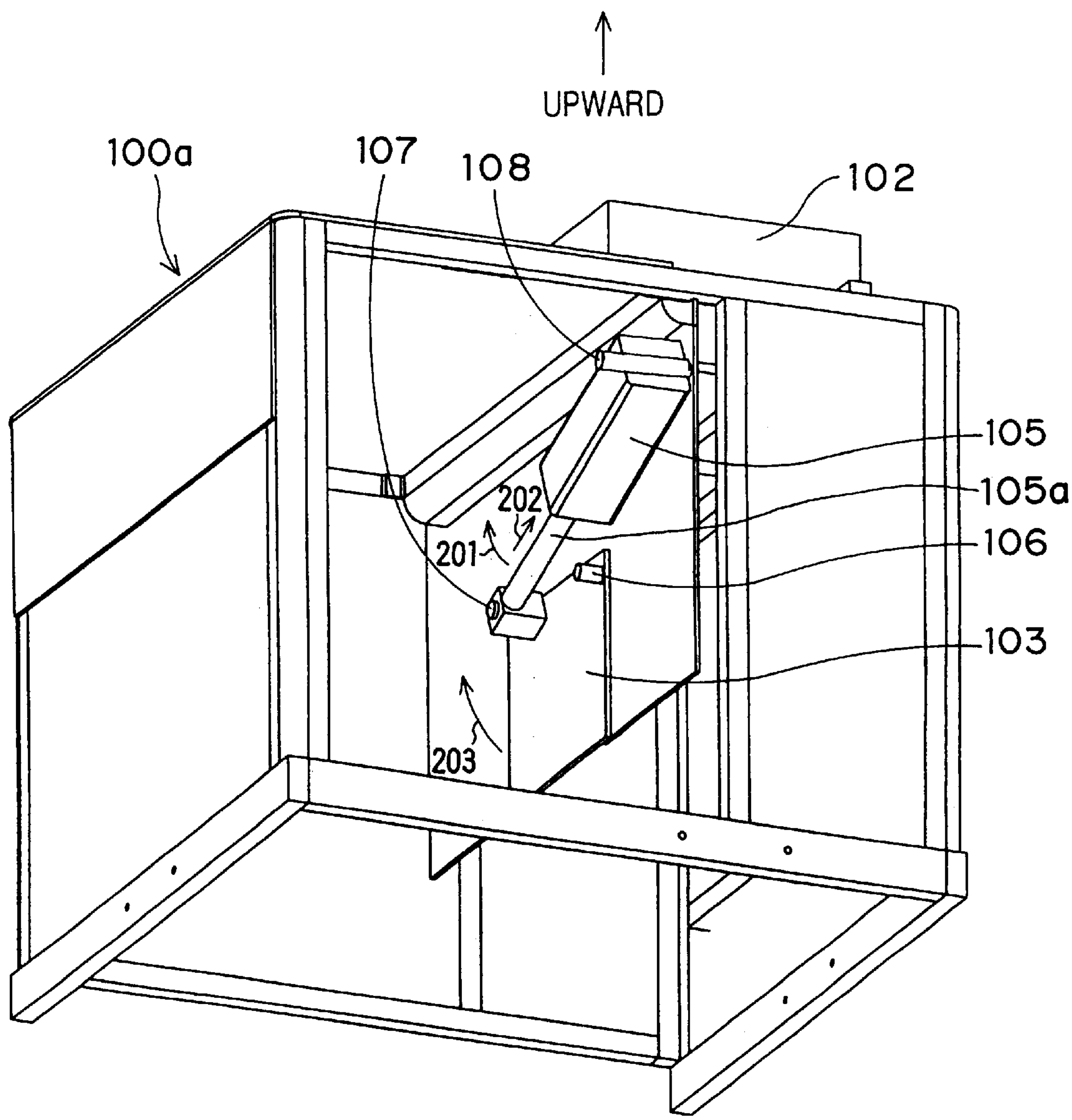
FIG. 7 is a partially cutaway perspective view showing an upper portion of a housing 100*a* for enclosing a measuring apparatus for a recording apparatus according to a second preferred embodiment of the present invention when seeing the same from a bottom front thereof.

FIG. 7 is a partially cutaway perspective view showing an upper portion of a housing 100*a* for enclosing a measuring apparatus for a recording apparatus according to a second preferred embodiment of the present invention when seeing the same from a bottom front thereof. The second preferred embodiment shows an example in which the self-rotation or auto-rotation of an air cylinder 105 is used to open and close the door. Only the differences between the first and second preferred embodiments will be described below.

Referring to FIG. 7, a pin 106 is rotatably mounted at one of four corners of the automatic door 103 in the housing 100*a* for enclosing the measuring apparatus, with a fulcrum of the one corner thereof. The automatic door 103 can rotate around the pin 106 in the direction shown by an arrow 203. Further, one end of a rod 105*a* of the air cylinder 105 is coupled with a pin 107 which is rotatably mounted at another corner of the automatic door 103 with a fulcrum of the corner thereof, that is, the pin 107 couples the automatic door 103 with the rod 105*a*. Furthermore, one end of a main body of the air cylinder 105 is coupled with a pin 108 which is rotatably mounted in the housing 100*a* for enclosing the measuring apparatus. In this case, when the rod 105*a* of the air cylinder 105 shrinks in the direction shown by an arrow 202, the rod 105*a* rotates around the pin 108 in the direction shown by an arrow 201, and thus the automatic door 103 rotates and opens around the pin 106 in the direction shown by the arrow 203.

In the housing 100*a* for enclosing the measuring apparatus configured as described above, the automatic door 103 can be opened upward in a manner similar to that of the first preferred embodiment, and the second preferred embodiment can have functions and advantageous effects similar to those of the first preferred embodiment.

In the second preferred embodiment, at least one of components which are coupled with each of the pins 106, 107 and 108 is necessary to be rotatably coupled with each of the pins 106, 107 and 108. Alternatively, both the components which are coupled with each of the pins 106, 107 and 108 may be rotatably coupled with each of the pins 106, 107 and 108.

Third Preferred Embodiment

Figure 8:
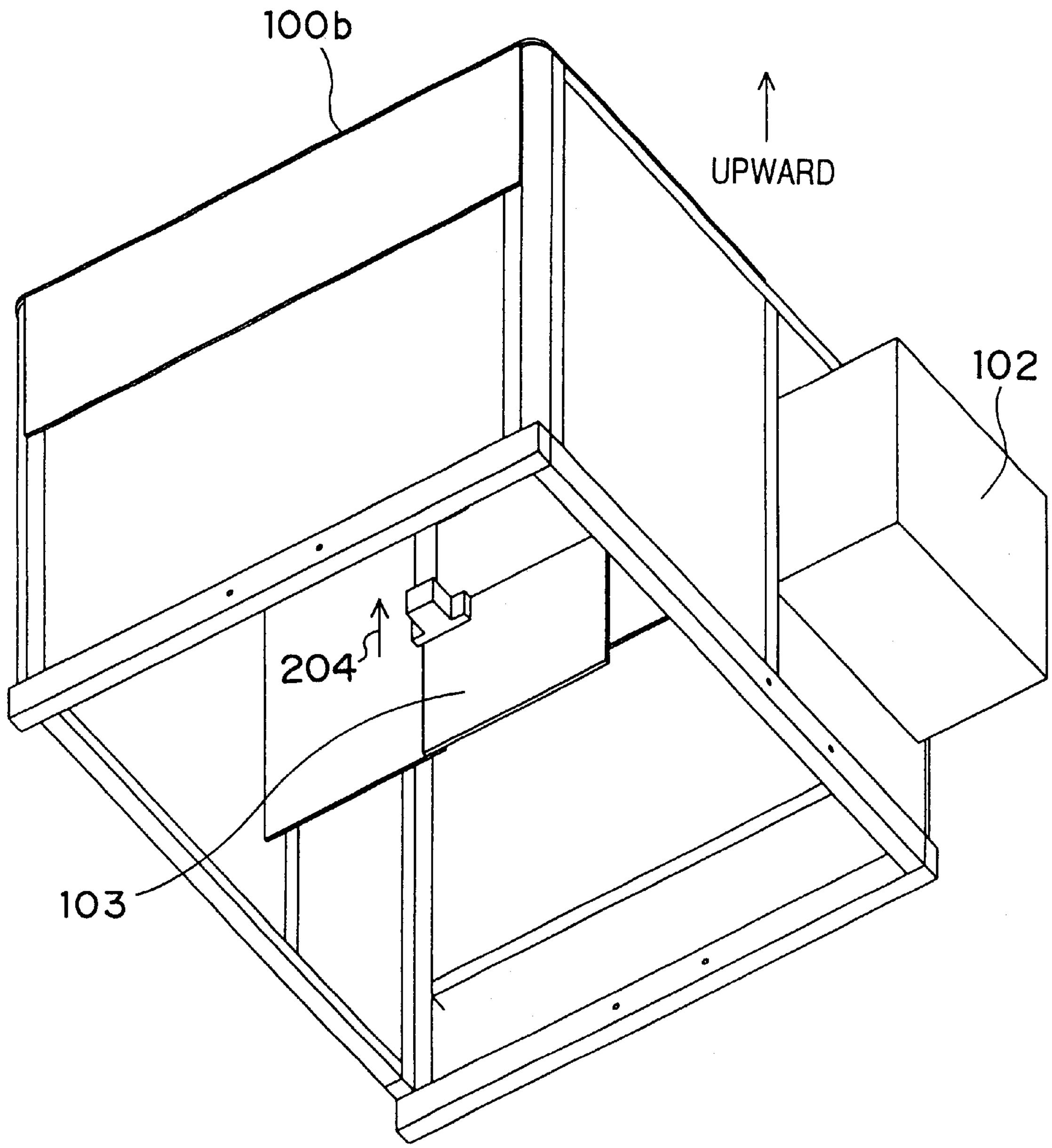
FIG. 8 is a partially cutaway perspective view showing an upper portion of a housing 100*b* for enclosing a measuring apparatus for a recording apparatus according to a third preferred embodiment of the present invention when seeing the same from a bottom front thereof.

FIG. 8 is a partially cutaway perspective view showing an upper portion of a housing 100*b* for enclosing a measuring apparatus for a recording apparatus according to a third preferred embodiment of the present invention when seeing the same from a bottom front thereof. The third preferred embodiment shows an example in which the fan 102 with the HEPA filter is located on a side surface of the housing 100*b* for enclosing the measuring apparatus. In this case, the automatic door 103 is configured to move and open upward in the direction shown by an arrow 204.

In the housing 100*b* for enclosing the measuring apparatus configured as described above, the automatic door 103 can be opened upward in a manner similar to that of the first preferred embodiment, and the third preferred embodiment can have functions and advantageous effects similar to those of the first preferred embodiment.

Advantageous Effects of Preferred Embodiments

As described in detail above, according to the preferred embodiments of the present invention, the housing for enclosing the measuring apparatus for the recording medium and the recording apparatus for recording a data signal on the recording medium comprises air blowing means including a high efficiency particulate air filter, where the air blowing means blowing air onto the recording medium and the recording apparatus under measurement through the high efficiency particulate air filter at a substantially constant air temperature and at a substantially constant air flow rate. Therefore, the housing can obtain the following specific advantageous effects.

(1) Since the air blowing means blows air into the housing for enclosing the measuring apparatus through the high efficiency particulate air filter, the blown air prevents heat from being confined within the housing for enclosing the measuring apparatus, and therefore, the measurement can be realized in a more stable environment, so that variation in the results of measurement of the recording medium such as the hard disk recording medium can become smaller than the variation in the results of measurement in the prior art. That is, it is possible to keep constant or maintain an environment such as a temperature, a temperature profile and air around the recording medium and the recording apparatus for writing a measurement signal on the recording medium, and to thus obtain stable results of measurement.

(2) Since the recording medium can keep on revolving, it is possible to substantially reduce the influence of expansion and contraction of the recording medium resulting from a change in temperature due to a change in revolution of the spindle.

(3) The longevity of the electric circuitry and the spindle motor in the recording apparatus for writing and reading a measurement signal on and from the recording medium can be increased.

(4) Since air is always blown, the spindle motor can always keep on revolving, so that the measurement can be performed without consideration of the start speed of the spindle motor.

Although the present invention has been fully described in connection with the preferred embodiments thereof with reference to the accompanying drawings, it is to be noted that various changes and modifications are apparent to those skilled in the art. Such changes and modifications are to be understood as included within the scope of the present invention as defined by the appended claims unless they depart therefrom.

What is claimed is:

1. A housing comprising:

a measuring apparatus for a recording medium and a recording apparatus enclosed by said housing;

air blowing means, including a high efficiency particulate air filter, blowing air onto said recording medium and said recording apparatus under measurement through said high efficiency particulate air filter at a substantially constant air temperature and at a substantially constant air flow rate; and an automatic door, said automatic door, in cooperation with said housing and air blowing means defining an air protection area within said housing encompassing said recording medium under measurement by said recording apparatus, said recording apparatus, and a predetermined surrounding area, and said automatic door shielding said air protection area from other areas of said housing in the instance said recording medium is not subject to measurement.

2. The housing as claimed in claim 1, further comprising an outer door, said outer door operable to be opened and closed when said automatic door is in a closed position, shielding said air protection area from said other areas of said housing.

3. The housing as claimed in claim 1, further comprising moving means for moving said recording medium and said recording apparatus to be measured, to said air protection area when said automatic door is in an open position.

4. The housing as claimed in claim 2, further comprising moving means for moving said recording medium and said recording apparatus to be measured, to said air protection area when said automatic door is in an open position.

5. The housing as claimed in claim 1, wherein said recording medium is a hard disk recording medium, and said recording apparatus comprises a magnetic head.

6. The housing as claimed in claim 2, wherein said recording medium is a hard disk recording medium, and said recording apparatus comprises a magnetic head.

7. The housing as claimed in claim 3, wherein said recording medium is a hard disk recording medium, and said recording apparatus comprises a magnetic head.

8. The housing as claimed in claim 4, wherein said recording medium is a hard disk recording medium, and said recording apparatus comprises a magnetic head.

* * * * *